United States Patent [19]
Chung et al.

[11] Patent Number: 5,292,684
[45] Date of Patent: Mar. 8, 1994

[54] SEMICONDUCTOR DEVICE WITH IMPROVED CONTACT AND METHOD OF MAKING THE SAME

[75] Inventors: In S. Chung, Ichonkun; Youn J. Kim, Seongnamsi, both of Rep. of Korea

[73] Assignee: Hyundai Electronics Industries Co., Ltd., Ichonkun, Rep. of Korea

[21] Appl. No.: 36,897

[22] Filed: Mar. 25, 1993

[30] Foreign Application Priority Data

Mar. 28, 1992 [KR] Rep. of Korea ............... 1992-5201

[51] Int. Cl.[5] ........................................... H01L 21/28
[52] U.S. Cl. ........................... 437/69; 437/186; 437/187; 437/180
[58] Field of Search ............... 437/69, 186, 187, 180

[56] References Cited

U.S. PATENT DOCUMENTS

| | | |
|---|---|---|
| 3,681,153 | 1/1970 | Clark et al. |
| 4,325,169 | 4/1982 | Ponder et al. |
| 4,740,483 | 4/1988 | Tobin. |
| 5,008,216 | 4/1991 | Huang et al. |
| 5,169,800 | 12/1992 | Kobayashi. |

FOREIGN PATENT DOCUMENTS

| | | |
|---|---|---|
| 59-5671 | 1/1984 | Japan. |
| 59-27530 | 2/1984 | Japan. |
| 59-88824 | 4/1984 | Japan. |
| 60-217645 | 10/1985 | Japan. |
| 132651 | 2/1989 | Japan. |

Primary Examiner—George Fourson

[57] ABSTRACT

A semiconductor device with an improved contact capable of improving junction breakdown voltage and junction leakage current by forming a contact at an active region without damaging bird's beak portions of its element-isolation oxide films and a method of making this semiconductor device. The semiconductor device comprises element-isolation oxide films formed on a semiconductor substrate, an etch barrier material film formed on bird's beak portions of element-isolation oxide films, an insulating film formed over the element-isolation oxide films and the etch barrier material layer, and a conductive material layer formed over the insulating film and in contact with the active region. In order to prevent the bird's beak portions of element-isolation oxide films from being damaged upon the formation of contact hole, the etch barrier material film has an etch selectivity different from that of a silicon oxide film formed on the active region.

4 Claims, 3 Drawing Sheets

SEMICONDUCTOR DEVICE WITH IMPROVED CONTACT AND METHOD OF MAKING THE SAME

BACKGROUND OF THE INVENTION

1. Field of the Invention

The present invention relates to a semiconductor device with an improved contact obtained by an etch selectivity difference between its polysilicon film and its oxide film and a method of making the same.

2. Description of the Prior Art

As the integration degree of semiconductor devices becomes high, the cell size is gradually reduced. All known techniques for forming active regions and element-isolation regions encounter a difficulty in obtaining sufficient areas for active regions, since the element-isolation oxide films form structures having a bird's beak shape with a certain size. This results in a difficulty in forming contacts at active regions.

Referring to FIGS. 1A to 1D, there is illustrated a conventional method of forming contacts.

In accordance with this method, first, on a semiconductor substrate 1a, element-isolation oxide films 1b having a bird's beak shape with a certain size are grown which define an active region and an insulating isolation region, as shown in FIG. 1A. In the active region, impurity ions are implanted so as to form a first diffusion region 2.

On the upper surface of the resulting entire structure including the active region and the insulating region are then deposited an insulating film 3 with a proper thickness and a photoresist 4, in this order, as shown in FIG. 1B. In FIG. 1B, the photoresist 4 is shown as having been patterned.

Using the pattern of the photoresist 4 as a mask, the insulating film 3 is then subjected to etching, so as to form a contact hole, as shown in FIG. 1C. At this time, each element-isolation oxide film 1b is also partially etched at its portion having the bird's beak shape.

As shown in FIG. 1D, a conductive material layer 5 is then deposited on the upper surface of the resulting entire structure such that the contact hole is filled with the conductive material layer 5. Since each element-isolation oxide film 1b is partially etched at its portion having the bird's beak shape, the conductive material layer 5 is deeply diffused at edges of the first diffusion region 2. As a result, a second diffusion region 6 which is unnecessary is formed.

Where the active region is wide, the element-isolation oxide films are not damaged by forming the contact hole at their portions having the bird's beak shape, as shown in FIG. 2, so that a normal contact can be obtained. In cases of highly integrated devices with narrow active regions above-mentioned, however, the element-isolation oxide films are partially etched at their bird's beak portions each positioned at a boundary between the active region and the element-isolation oxide film, thereby causing the impurity junction structure at the etched region to be weak. As a result, there are problems of a weakness in junction breakdown voltage and an increase in junction leakage current.

SUMMARY OF THE INVENTION

Therefore, an object of the invention is to provide a semiconductor device with an improved contact capable of improving junction breakdown voltage and junction leakage current by forming a contact at an active region without damaging bird's beak portions of its element-isolation oxide films and a method of making this semiconductor device.

In accordance with one aspect, the present invention provides a semiconductor device comprising a semiconductor substrate, element-isolation oxide films formed on said semiconductor substrate, each of said element-isolation oxide films having a portion with a bird's beak shape at its edge, and an impurity diffusion region formed between said element-isolation oxide films and adapted as an active region, said semiconductor device further comprising: an etch barrier material film formed on said bird's beak portions of the element-isolation oxide films; an insulating film formed on the element-isolation oxide films and said etch barrier material layer; and a conductive material layer formed on said insulating film and in contact with the impurity diffusion region.

In accordance with another aspect, the present invention provides a method of making a semiconductor device comprising the steps of: forming element-isolation oxide films on a semiconductor substrate and forming an impurity diffusion region as an active region by implanting impurity ions in a portion of the semiconductor substrate between said element-isolation oxide films; forming an oxide film on said impurity diffusion region; depositing an etch barrier material film on edges of the element-isolation oxide films and said oxide film; and coating an insulating film on an upper surface of the resulting entire structure, forming a contact hole through which said active region is exposed, by etching said insulating film, said etch barrier material film and the oxide film at their portions disposed over the active region, and depositing a conductive material film over an upper surface of the resulting entire structure.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
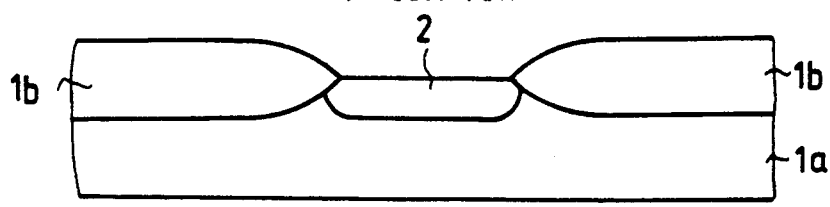
FIGS. 1A to 1D are schematic sectional views illustrating a conventional method of forming contacts.
Figure 1B:
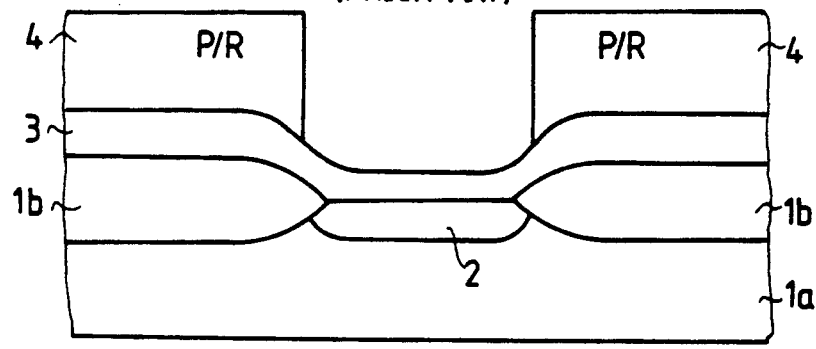
Figure 1C:
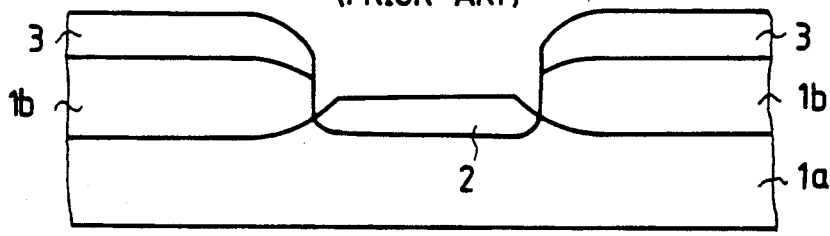
Figure 1D:
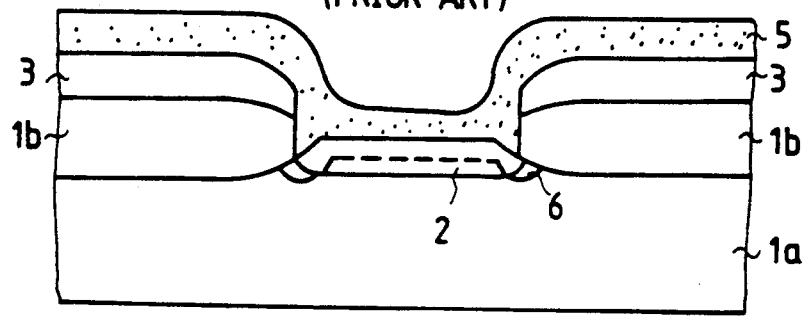
Figure 2:
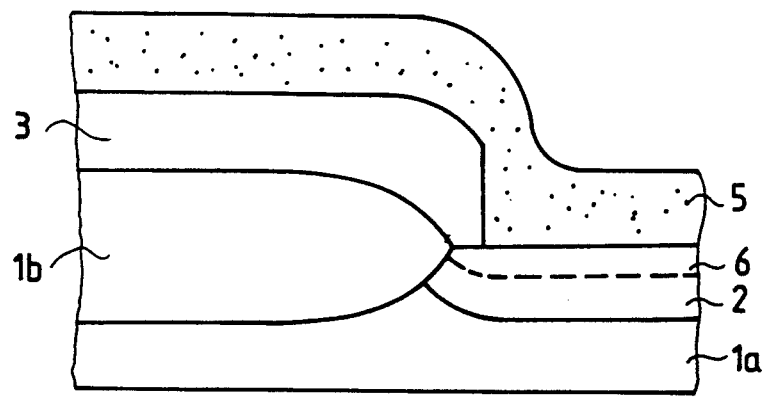
FIG. 2 is a schematic sectional view illustrating a contact formed in accordance with another conventional method.
Figure 3:
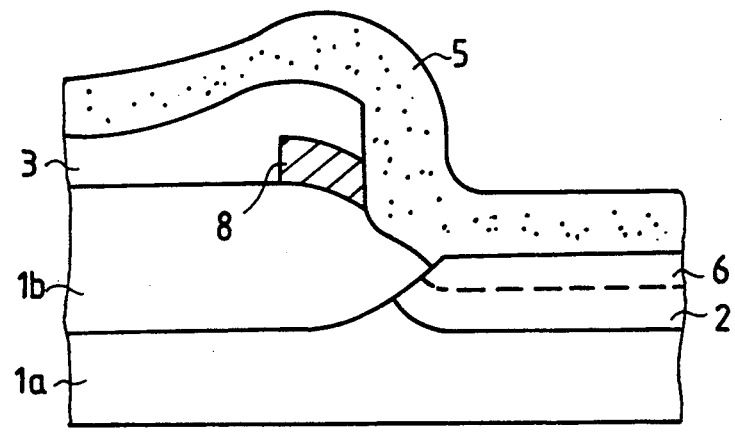
FIG. 3 is a schematic sectional view illustrating a contact formed in accordance with the present invention.

Referring to FIG. 3, there is illustrated a semiconductor device with an improved contact in accordance with the present invention.

As shown in FIG. 3, the semiconductor device comprises a semiconductor substrate 1a, element-isolation oxide films 1b formed on the semiconductor substrate 1a, and a first impurity diffusion region 2 positioned between the element-isolation oxide films 1b to define an active region. Each element-isolation oxide film 1b has a portion having a bird's beak shape at its edge. In accordance with the present invention, the semiconductor device also comprises an etch barrier material film 8 formed on the bird's beak portions of element-isolation oxide films 1b, an insulating film 3 formed over the element-isolation oxide films 1b and the etch barrier material layer 8 and adapted to provide an insulation among neighboring films, and a conductive material layer 5 formed on the insulating film 3 and in contact with the first impurity diffusion region 2.

Referring to FIGS. 4A to 4E, there is illustrated a method of making the semiconductor device with the structure shown in FIG. 3, in accordance with the present invention.

Figure 4A:
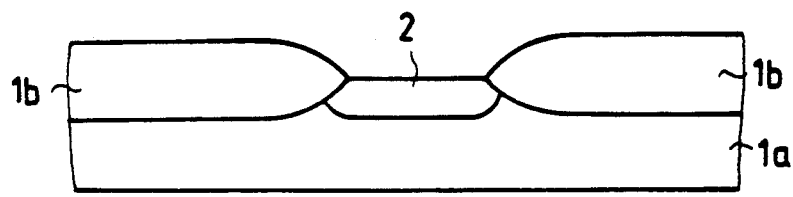
FIGS. 4A to 4E are schematic sectional views illustrating a method of forming contacts in accordance with the present invention.

In accordance with this method, first, on a semiconductor substrate 1a are formed element-isolation oxide films 1b each having a bird's beak portion, as shown in FIG. 4A. Thereafter, impurity ions are implanted in a portion of the semiconductor substrate 1a defined between the element-isolation oxide films 1b, so as to form a first impurity diffusion region 2.

Figure 4B:
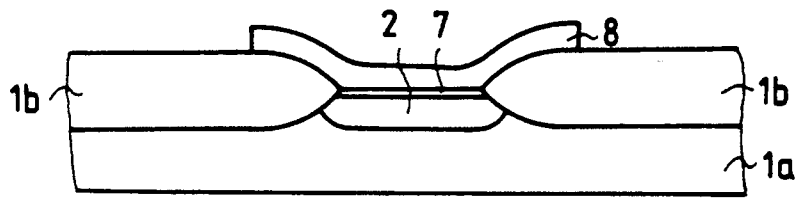

As shown in FIG. 4B, a silicon oxide film 7 is then formed on the first impurity diffusion region 2. The silicon oxide film 7 has a thickness of not more than 500 Å. Thereafter, an etch barrier material film 8 with a predetermined thickness is deposited on the bird's beak portions of element-isolation oxide films 1b and the silicon oxide film 7. The silicon oxide film 7 serves to prevent the semiconductor substrate 1a from being damaged by the etch barrier material film 8. The etch barrier material film 8 has an etch selectively different from that of the silicon oxide film 7 and is made of polysilicon or silicon nitride.

Figure 4C:
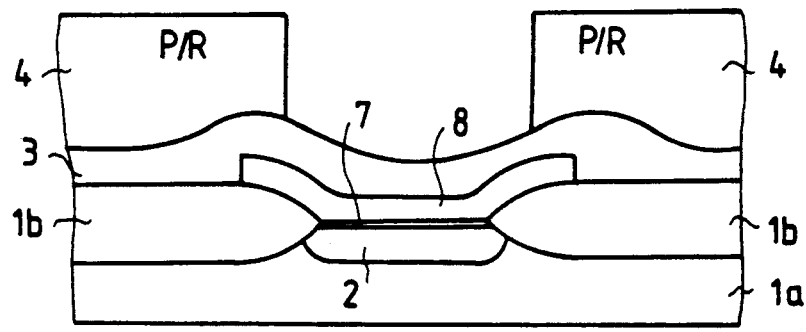

On the upper surface of the resulting entire structure, an insulating film 3 with a predetermined thickness is deposited, so as to insulate neighboring films, as shown in FIG. 4C. On the insulating film 3 is deposited a photoresist 4 which is, in turn, subjected to a patterning for removing its portion disposed above the active region.

Figure 4D:
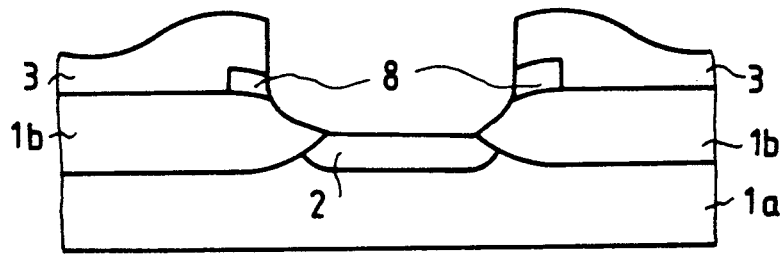

Using the pattern of photoresist 4 as a mask, thereafter, the insulating film 3 and the etch barrier material film 8 are etched, so as to remove their portions disposed over the active region at which a contact hole will be formed. By this etching, the silicon oxide film 7 is exposed at its portion disposed on the active region. The exposed portion of silicon oxide film 7 is then removed, so as to form the contact hole, as shown in FIG. 4D. Since the etch barrier material film 8 has an etch selectivity different from that of the element-isolation oxide film 1b of the bird's beak portion, it is possible to prevent the bird's beak portions of element-isolation oxide films 1b from being damaged upon the formation of contact hole.

Figure 4E:
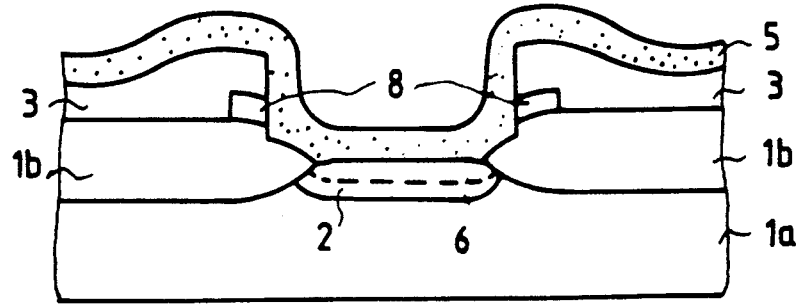

On the upper surface of the resulting entire structure is finally deposited a film 5 of a conductive material such as polysilicon, polycide, silicide or aluminum, then a second impurity diffusion region 6 is formed within the first impurity diffusion region 2, as shown in FIG. 4E. Thus, an improved contact is obtained.

As apparent from the above description, the present invention provides an improved contact of semiconductor devices capable of preventing a decrease in junction breakdown voltage and an increase in junction leakage current encountered in highly integrated semiconductor devices with narrow active regions. Accordingly, it is possible to improve a refresh characteristic of semiconductor devices. Such an improved refresh characteristic also provides a useful effect when the semiconductor devices are used as low power devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of making a semiconductor device comprising the steps of:

forming element-isolation oxide films on a semiconductor substrate and forming an impurity diffusion region as an active region by implanting and diffusing impurity ions in a portion of the semiconductor substrate between said element-isolation oxide films;

forming an oxide film on said impurity diffusion region;

depositing an etch barrier material film on edges of the element-isolation oxide films adjacent the active region and said oxide film while leaving portions of the element-isolation oxide films exposed; and coating an insulating film on the upper surface of the resulting entire structure, forming a contact hole through which said active region is exposed, by etching said insulating film, said etch barrier material film and the oxide film at their portions disposed over the active region, and depositing a conductive material film over the upper surface of the resulting entire structure.

2. A method in accordance with claim 1, wherein said etch barrier material film is a polysilicon film or a silicon nitride film.

3. A method in accordance with claim 1, wherein said oxide film is a silicon oxide film having a thickness of not more than 500 Å.

4. A method in accordance with claim 1, wherein said conductive material film is made of one selected from the group consisting of polysilicon, polycide, silicide and aluminum.

* * * * *